(12) United States Patent
Horii et al.

(10) Patent No.: US 9,304,558 B2
(45) Date of Patent: Apr. 5, 2016

(54) ELECTRONIC APPARATUS

(71) Applicant: KABUSHIKI KAISHA TOSHIBA, Minato-ku, Tokyo (JP)

(72) Inventors: Yasuyuki Horii, Ome (JP); Hikaru Hirata, Kawasaki (JP); Hisao Tsukazawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 14/248,847

(22) Filed: Apr. 9, 2014

(65) Prior Publication Data

US 2015/0062818 A1  Mar. 5, 2015

(30) Foreign Application Priority Data

Aug. 30, 2013 (JP) ................. 2013-179522

(51) Int. Cl.
  *G06F 1/20* (2006.01)
  *H05K 7/20* (2006.01)
  *G06F 1/16* (2006.01)

(52) U.S. Cl.
  CPC .............. *G06F 1/203* (2013.01); *G06F 1/1616* (2013.01); *H05K 7/20145* (2013.01)

(58) Field of Classification Search
  CPC ...................................... G06F 1/203
  See application file for complete search history.

(56) References Cited

U.S. PATENT DOCUMENTS

| 6,493,222 | B2 * | 12/2002 | DiFonzo | G06F 1/1616 165/80.3 |
| 6,917,521 | B2 * | 7/2005 | Tomioka | G06F 1/203 257/E23.099 |
| 7,924,563 | B2 * | 4/2011 | Kobayashi | G06F 1/203 361/694 |
| 8,408,981 | B2 * | 4/2013 | Su | F04D 29/441 165/104.34 |
| 8,422,224 | B2 * | 4/2013 | Tanaka | G06F 1/203 165/104.33 |
| 8,593,805 | B2 * | 11/2013 | Chen | G06F 1/203 165/104.33 |
| 8,811,010 | B2 * | 8/2014 | Wang | H01L 23/467 165/185 |
| 8,891,234 | B2 * | 11/2014 | Huang | G06F 1/20 165/80.2 |
| 8,937,806 | B2 * | 1/2015 | Senatori | H05K 7/20127 165/104.33 |
| 2002/0080579 | A1 * | 6/2002 | Shibasaki | G06F 1/203 361/688 |
| 2006/0144573 | A1 * | 7/2006 | Nitta | H01L 23/467 165/104.33 |

(Continued)

FOREIGN PATENT DOCUMENTS

| JP | 4823374 B1 | 11/2011 |
| WO | WO 2011/061857 A1 | 5/2011 |
| WO | WO 2011/067860 A1 | 6/2011 |

*Primary Examiner* — Robert J Hoffberg
(74) *Attorney, Agent, or Firm* — Knobbe, Martens, Olson & Bear LLP

(57) ABSTRACT

According to one embodiment, an electronic apparatus includes a first housing and a second housing. The first housing includes a first wall, a second wall opposite to the first wall, and a third wall between the first wall and the second wall. The third wall faces the second housing when the second housing is raised from the first housing. The third wall includes an outmost portion of the third wall in a direction from a fan toward the third wall, a first area obliquely extending between the outmost portion and the first wall and including a first opening, and the second area obliquely extending between the outmost portion and the second wall and including a second opening.

8 Claims, 8 Drawing Sheets

(56) References Cited

U.S. PATENT DOCUMENTS

| | | | | |
|---|---|---|---|---|
| 2009/0321047 A1* | 12/2009 | Chen | G06F 1/203 | 165/80.3 |
| 2010/0039772 A1* | 2/2010 | Nitta | H01L 23/467 | 361/697 |
| 2011/0279977 A1 | 11/2011 | Tanaka | | |
| 2011/0310561 A1* | 12/2011 | Hata | G06F 1/203 | 361/697 |
| 2012/0205084 A1* | 8/2012 | Huang | G06F 1/203 | 165/181 |
| 2013/0155611 A1* | 6/2013 | Yang | G06F 1/203 | 361/692 |
| 2013/0170133 A1* | 7/2013 | Fu | G06F 1/20 | 361/679.47 |
| 2013/0286590 A1* | 10/2013 | Iwata | H05K 7/20136 | 361/697 |
| 2014/0133102 A1* | 5/2014 | Lu | G06F 1/203 | 361/700 |
| 2014/0144608 A1* | 5/2014 | Zeng | G06F 1/203 | 165/104.25 |
| 2014/0313668 A1* | 10/2014 | Hsu | H01L 23/00 | 361/697 |
| 2015/0084490 A1* | 3/2015 | Fujiwara | G06F 1/1613 | 312/236 |

\* cited by examiner

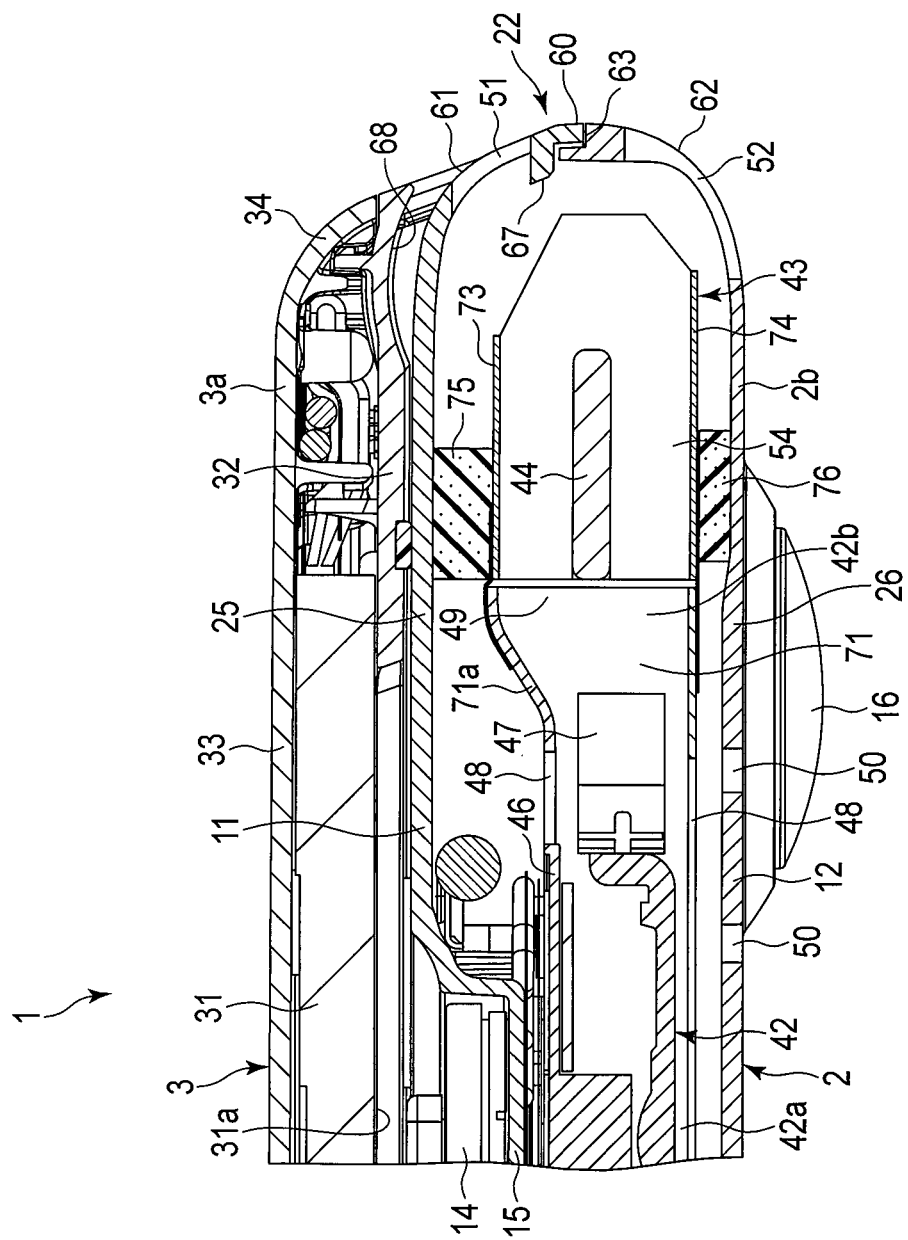
F I G. 5

ELECTRONIC APPARATUS

CROSS-REFERENCE TO RELATED APPLICATIONS

This application is based upon and claims the benefit of priority from Japanese Patent Application No. 2013-179522, filed Aug. 30, 2013, the entire contents of which are incorporated herein by reference.

FIELD

Embodiments described herein relate generally to electronic apparatuses.

BACKGROUND

An electronic apparatus comprising a housing with a plurality of exhaust apertures, and a fan contained in the housing is provided.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 5 is an exemplary sectional view of the electronic apparatus shown in FIG. 1 (opening angle 0°).

DETAILED DESCRIPTION

Various embodiments will be described hereinafter with reference to the accompanying drawings.

In general, according to one embodiment, an electronic apparatus comprises a first housing, a fan in the first housing, and a second housing rotatably attached to the first housing. The first housing comprises a first wall, a second wall opposite to the first wall, and a third wall between the first wall and the second wall. The third wall faces the second housing when the second housing is raised from the first housing. The third wall comprises an outmost portion of the third wall in a direction from the fan toward the third wall, a first area obliquely extending between the outmost portion and the first wall and comprising a first opening, and the second area obliquely extending between the outmost portion and the second wall and comprising a second opening.

Some components are expressed by two or more terms. Those terms are just examples. Those components may be further expressed by another or other terms. And the other components which are not expressed by two or more terms may be expressed by another or other terms.

FIGS. 1 to 9 show an electronic apparatus 1 according to an embodiment. The electronic apparatus 1 is, for example, a notebook portable computer. It should be noted that an electronic apparatus to which this embodiment can be applied is not limited to the example. This embodiment can be widely applied to various electronic apparatuses such as a television, a tablet-type (i.e., slate-type) portable computer, a mobile phone (including a smart phone) and a game console.

Figure 1:
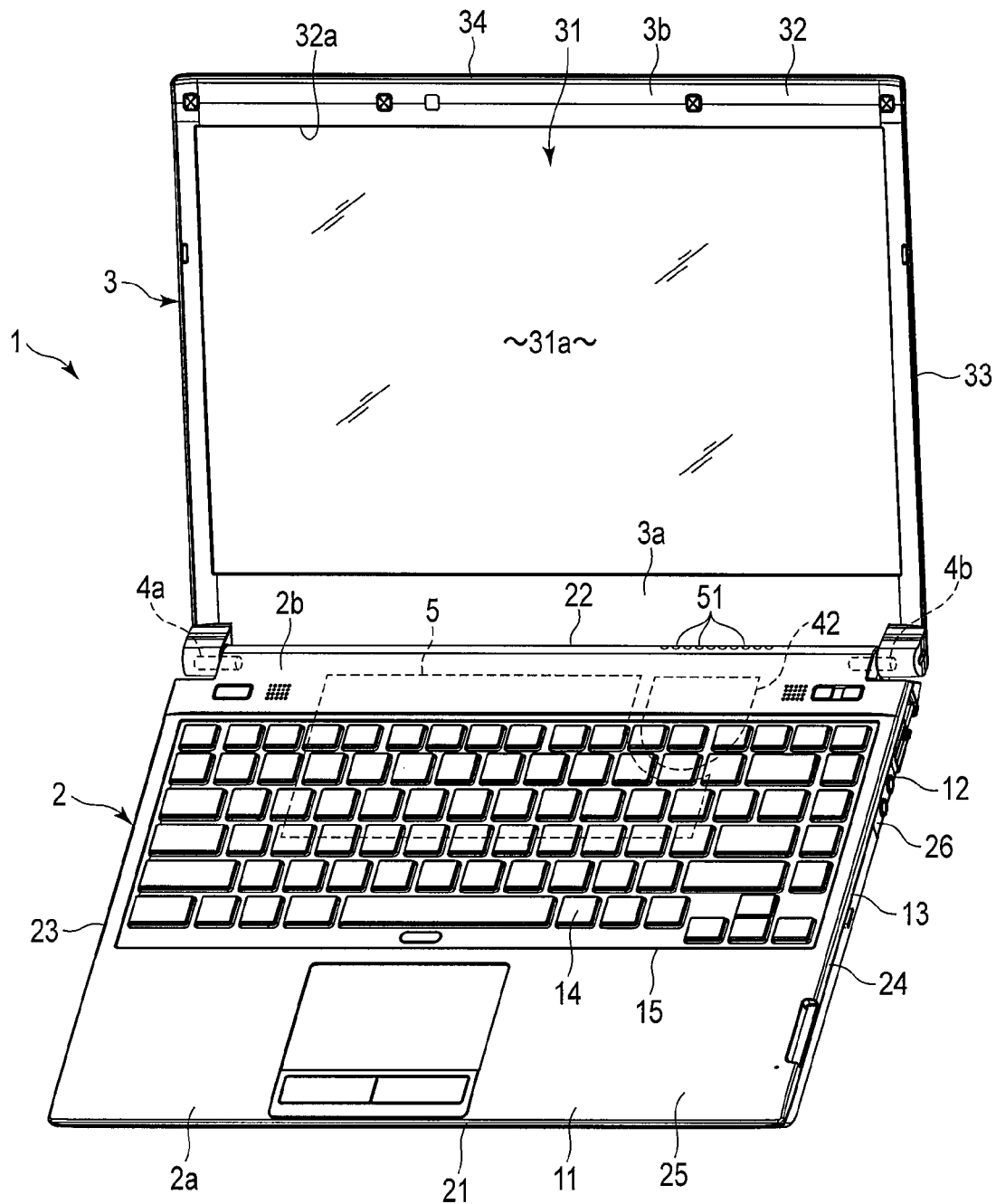
FIG. 1 is an exemplary perspective view of an electronic apparatus according to an embodiment.

As shown in FIG. 1, the electronic apparatus 1 comprises a first housing 2, a second housing 3 and a pair of hinges 4a and 4b. The first housing 2 is, for example, a main housing. A circuit board 5 which is a main board, for example, is contained in the first housing 2.

The first housing 2 comprises an upper wall 11, a lower wall 12 (i.e., bottom wall) and a peripheral wall 13, and takes the form of a flat box. The upper wall 11 is an example of a first wall. The lower wall 12 is an example of a second wall. It should be noted that top and bottom and right and left are defined from a user's viewpoint in this specification. Also, a side closer to the user is defined as front and the farther side is defined as rear.

The upper wall 11 extends in a longitudinal direction (e.g., substantially horizontal direction) of the first housing 2. A keyboard attaching portion 15 to which a keyboard 14 as an input portion can be attached is provided on the upper wall 11. The keyboard attaching portion 15 is a depression provided on the upper wall 11. Thus, an area in which the keyboard attaching portion 15 is provided has smaller space than other areas in the first housing 2. It should be noted that an attaching portion provided on the upper wall 11 is not limited to the keyboard attaching portion 15, and for example, a touch panel (i.e., touch sensor) or other input devices may be attached.

The lower wall 12 is located opposite to the upper wall 11. The lower wall 12 extends substantially parallel to, for example, the upper wall 11. When the electronic apparatus 1 is put on a desk, the lower wall 12 faces an upper surface of the desk (i.e., outside placement surface). The lower wall 12 comprises, for example, a plurality of legs 16 (i.e., supporting portions, see FIG. 5). The legs 16 are in contact with the upper surface of the desk and support the electronic apparatus 1, when the electronic apparatus 1 is put on the desk.

The peripheral wall 13 extends in a direction crossing the upper wall 11 and the lower wall 12, and connects a peripheral portion of the lower wall 12 and that of the upper wall 11. The peripheral wall 13 extends in a thickness direction of the first housing 2. The first housing 2 comprises a first end 2a (e.g., front end) and a second end 2b (e.g., rear end) located opposite to the first end 2a.

The peripheral wall 13 comprises a front wall 21, a rear wall 22, a left sidewall 23 and a right sidewall 24. The front wall 21 is located in the first end 2a, and extends in a right and left direction (i.e., width direction) of the first housing 2. The rear wall 22 is located in the second end 2b, and extends substantially parallel to the front wall 21. The rear wall 22 is an example of a third wall. The rear wall 22 extends between a rear end of the upper wall 11 and that of the lower wall 12. The left sidewall 23 and the right sidewall 24 extend in a back and forth direction (i.e., depth direction) of the first housing 2 which crosses the front wall 21 and the rear wall 22, and connect each of an end of the front wall 21 and that of the rear wall 22.

Also, the first housing 2 comprises an upper cover 25 (i.e., cover) and a lower cover 26 (i.e., base). The upper cover 25 comprises the upper wall 11 and part of the peripheral wall 13. The lower cover 26 comprises the lower wall 12 and the rest of the peripheral wall 13. The first housing 2 is formed by combining the upper cover 25 and the lower cover 26.

On the other hand, the second housing 3 is, for example, a display housing. A display device 31 (i.e., display module or unit) is contained in the second housing 3. An example of the display device 31 is a liquid crystal display device, but the display device 31 is not limited to the example. The display device 31 comprises a display screen 31a on which an image is displayed.

The second housing 3 comprises a front wall 32 (i.e., lower wall or first wall), a back wall 33 (i.e., rear wall, upper wall or second wall) and a peripheral wall 34 (i.e., sidewall or third wall), and takes the form of a flat box. An opening 32a from which the display screen 31a is exposed is provided on the front wall 32. The back wall 33 is located opposite to the front wall 32, and extends substantially parallel to the front wall 32. The back wall 33 covers a back surface of the display device 31. The peripheral wall 34 extends in a direction crossing the front wall 32 and the back wall 33, and connects a peripheral portion of the front wall 32 and that of the back wall 33. The second housing 3 comprises a first end 3a (e.g., lower end) and a second end 3b (e.g., upper end) located opposite to the first end 3a.

The hinges 4a and 4b rotatably (i.e., openably and closably) connect the second end 2b of the first housing 2 and the first end 3a of the second housing 3. Consequently, the electronic apparatus 1 is openable and closable (i.e., deformable or foldable). The second housing 3 is rotatable between a first state (e.g., closed state) and a second state (e.g., open state).

The first state is a state where the second housing 3 overlaps the first housing 2, and the electronic apparatus 1 is closed. Specifically, the upper wall 11 of the first housing 2 and the front wall 32 of the second housing 3 face each other, and the display screen 31a and the keyboard 14 are hidden from the outside. On the other hand, the second state is a state where the second housing 3 is raised from the first housing 2, and the electronic apparatus 1 is open. In the second state, the display screen 31a and the keyboard 14 are exposed to the outside. Also, in the second state, the first end 3a of the second housing 3 is arranged in a horizontal direction of the rear wall 22 of the first housing 2, and faces the rear wall 22 from behind (see, for example, FIG. 7).

Next, a thermal radiation structure of the electronic apparatus 1 will be described in detail.

Figure 2:
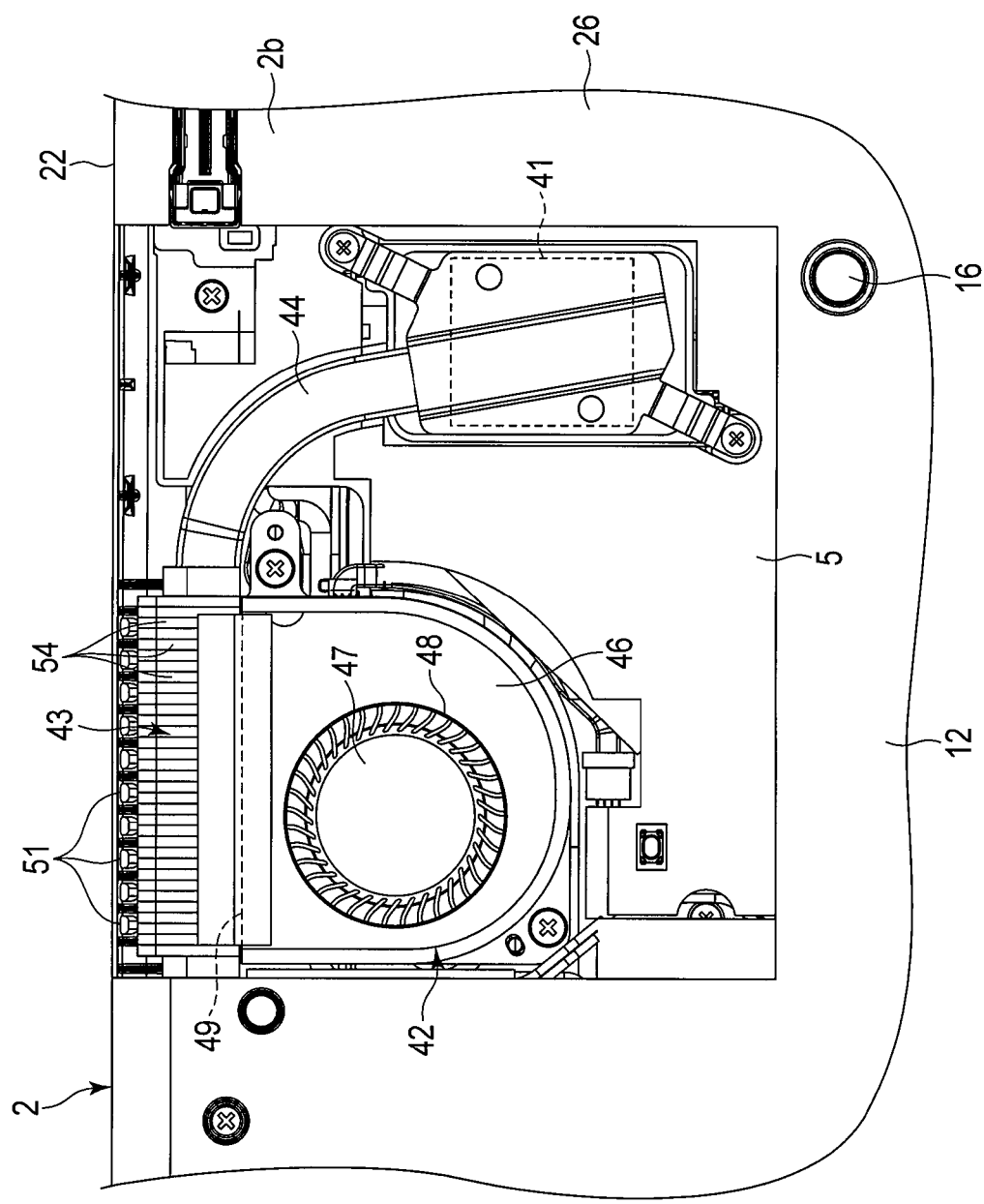
FIG. 2 is an exemplary bottom view illustrating part of an inside of the electronic apparatus shown in FIG. 1.

FIG. 2 is a bottom view illustrating part of an inside of the first housing 2. As shown in FIG. 2, a heat-emitting component 41 is mounted on the circuit board 5. The heat-emitting component 41 is, for example, a CPU or a graphics chip, but is not limited to them. A fan 42, a heat sink 43 and a heat pipe 44 are contained in the first housing 2.

The fan 42 is a centrifugal fan, and arranged near the second end 2b of the first housing 2. The fan 42 comprises a fan casing 46 and an impeller 47 driven and rotated in the fan casing 46. The fan casing 46 comprises suction openings 48 opened to an upper surface and a lower surface of the fan casing 46, and a discharge opening 49 opened to a side surface of the fan casing 46.

The suction opening 48 on the lower surface of the fan casing 46 faces the lower wall 12 of the first housing 2. The discharge opening 49 on a side surface of the fan casing 46 faces the rear wall 22 of the first housing 2. The fan 42 sends sucked air to the rear wall 22 of the first housing 2 by rotating the impeller 47.

Figure 3:
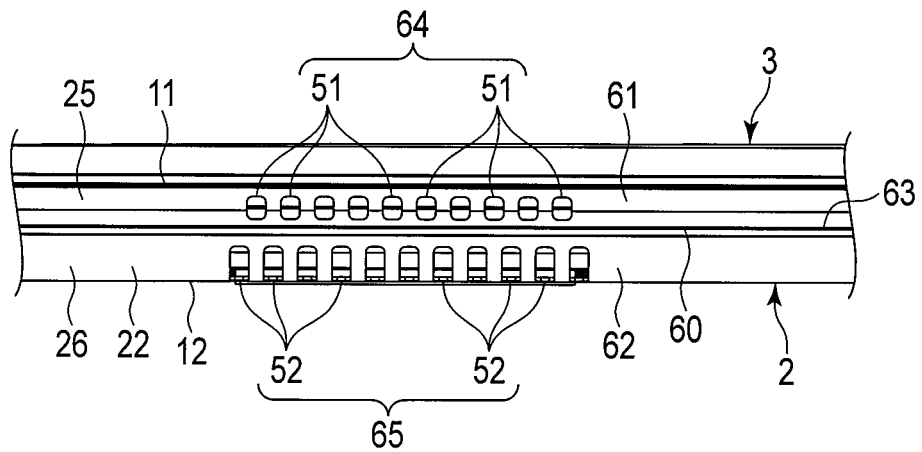
FIG. 3 is an exemplary back view of the electronic apparatus shown in FIG. 1.
Figure 4:
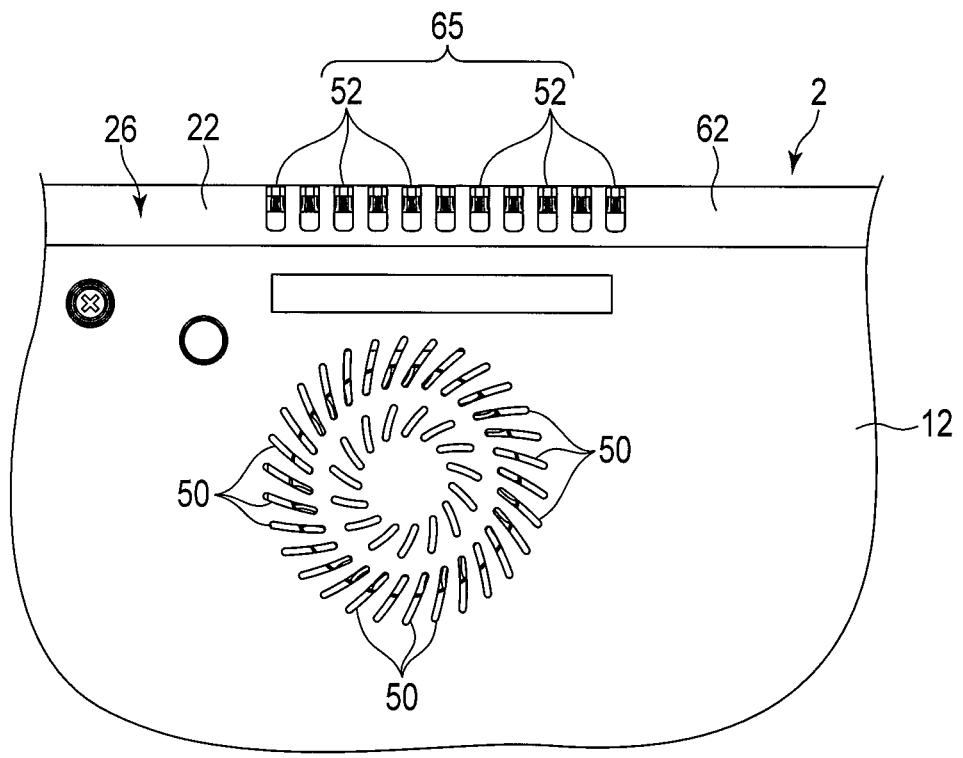
FIG. 4 is an exemplary bottom view of the electronic apparatus shown in FIG. 1.

On the other hand, as shown in FIGS. 3 and 4, a plurality of intake apertures 50 facing the suction opening 48 of the fan 42 are provided on the lower wall 12 of the first housing 2. Also, a plurality of exhaust apertures 51 and 52 facing the discharge opening 49 of the fan 42 are provided on the rear wall 22 of the first housing 2.

As shown in FIG. 2, the heat sink 43 is provided between the discharge opening 49 of the fan 42 and the exhaust apertures 51 and 52 of the first housing 2. The heat sink 43 is a fin unit in which a plurality of fins 54 are arranged. The fins 54 extend in a direction from the lower wall 12 toward the upper wall 11. The heat pipe 44 extends between the heat-emitting component 41 and the heat sink 43, and is thermally connected to both the heat-emitting component 41 and the heat sink 43. Accordingly, part of heat generated by the heat-emitting component 41 during use of the electronic apparatus 1 is transferred to the heat sink 43 by the heat pipe 44. Air from the fan 42 is discharged from the exhaust apertures 51 and 52 of the first housing 2 to the outside through the heat sink 43 by driving the fan 42. Consequently, thermal radiation of the heat-emitting component 41 is accelerated.

Next, the exhaust apertures 51 and 52 of the rear wall 22 of the first housing 2 will be described in detail.

As shown in FIG. 5, the rear wall 22 of the first housing 2 is formed, for example, in an arc shape along an end of the upper wall 11 and that of the rear wall 22. Specifically, the rear wall 22 comprises an outmost portion 60 (e.g., central portion, or top portion), a first area 61 (e.g., upper area) and a second area 62 (e.g., lower area). The outmost portion 60 is a portion located on the outmost position of the rear wall 22 in a direction from the fan 42 toward the rear wall 22.

Figure 6:
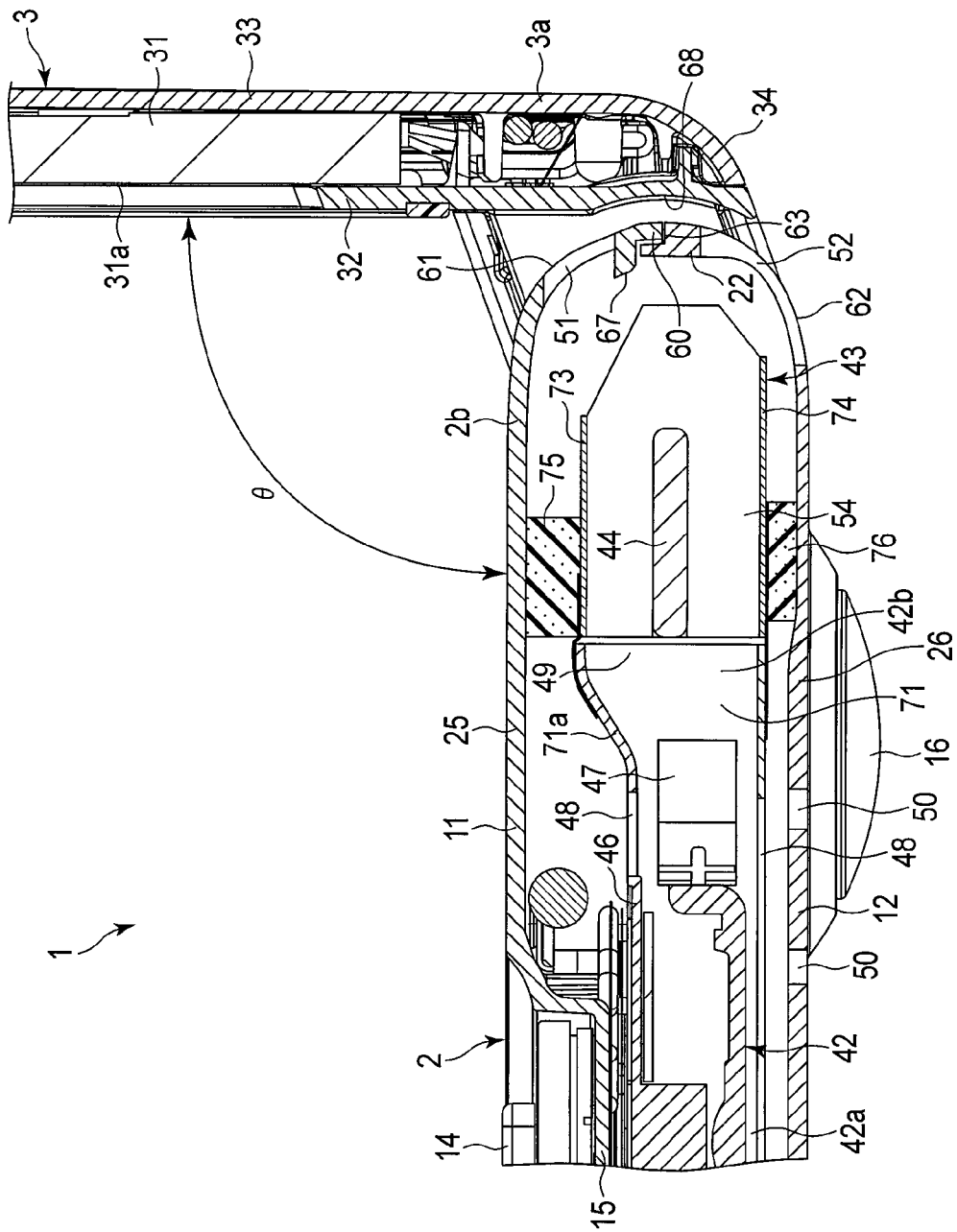
FIG. 6 is an exemplary sectional view of the electronic apparatus shown in FIG. 1 (opening angle 90°).

FIG. 6 shows the electronic apparatus 1 when an opening angle θ between the first housing 2 and the second housing 3 is 90°. The outmost portion 60 is a portion closest to the second housing 3 on the rear wall 22 when the opening angle is 90°. Also, the outmost portion 60 extends over the substantially whole width of the first housing 2 along a longitudinal direction of the rear wall 22 (i.e., longitudinal direction of the upper wall 11). The outmost portion 60 comprises a connection portion 63 (e.g., border or joint surface) of the upper cover 25 and the lower cover 26.

The first area 61 is a portion extending between the outmost portion 60 and the upper wall 11, and is inclined from the outmost portion 60 toward the upper wall 11. As shown in FIG. 6, the first area 61 is inclined in a direction away from the second housing 3 as it extends from the outmost portion 60 toward the upper wall 11 when the electric apparatus 1 has the opening angle of 90°.

The second area 62 is located opposite to the first area 61 relative to the outmost portion 60. The second area 62 is a portion extending between the outmost portion 60 and the lower wall 12, and is inclined from the outmost portion 60 toward the lower wall 12. The second area 62 is inclined in the direction away from the second housing 3 as it extends from the outmost portion 60 toward the lower wall 12, as well as the first area 61 when the electric apparatus 1 has the opening angle of 90°.

In other words, the first area 61 and the second area 62 extend from the outmost portion 60 toward the mutually opposite sides (e.g., upper side and lower side), and both of them are inclined toward a center of the first housing 2. It should be noted that the word "incline" indicates that the areas are inclined with respect to the thickness direction (e.g., substantially vertical direction) of the first housing 2 in this specification. Although the first area 61 and the second area 62 are curved in an arc shape in this embodiment, they may be, for example, surfaces inclined and extending linearly.

As shown in FIGS. 3 and 4, the plurality of first exhaust apertures 51 are provided in the first area 61. The plurality of first exhaust apertures 51 are arranged in a line in the longitudinal direction of the rear wall 22. The plurality of first exhaust apertures 51 form an example of a first opening 64 (i.e., first opening area). It should be noted that the first opening 64 may be formed by, for example, only one first exhaust aperture 51.

On the other hand, the plurality of second exhaust apertures 52 are provided in the second area 62. The plurality of second exhaust apertures 52 are arranged in a line in the longitudinal direction of the rear wall 22. The plurality of second exhaust apertures 52 form an example of a second opening 65 (i.e., second opening area). It should be noted that the second opening 65 may be formed by, for example, only one second exhaust aperture 52.

The number of second exhaust apertures 52 is larger than that of first exhaust apertures 51. The plurality of first exhaust apertures 51 and the plurality of second exhaust apertures 52 are mutually shifted to be alternately positioned in the longitudinal direction of the rear wall 22 (i.e., in zigzags). As a result, the plurality of first exhaust apertures 51 and the plurality of second exhaust apertures 52 do not overlap with each other in the thickness direction of the first housing 2. Alternatively, even if they overlap, the overlap is small.

As shown in FIGS. 5 and 6, the first exhaust apertures 51 are located higher than the outmost portion 60. The first exhaust apertures 51 are provided in the obliquely extending first area 61, and opened behind and above the first housing 2. It should be noted that the aperture opened above indicates that the aperture is in sight from the perspective of a direction vertical to the upper wall 11.

Projections 67 projecting inside the first housing 2 are provided in a lower edge portions of the first exhaust apertures 51. The projection 67 is provided along the lower edge portion of the first exhaust aperture 51. Consequently, strength around the first exhaust aperture 51 is increased, and a reduction in rigidity of the first housing 2 caused by providing the first exhaust aperture 51 is suppressed.

On the other hand, the second exhaust apertures 52 are located lower than the outmost portion 60. The second exhaust apertures 52 are provided in the obliquely extending second area 62, and opened behind and below the first housing 2. It should be noted that "the aperture opened below" indicates that the aperture is in sight from the perspective of a direction vertical to the lower wall 12.

As shown in FIG. 6, part of the second exhaust aperture 52 (e.g., lower part) is located lower than a lower end of the second housing 3 when the electric apparatus 1 has the opening angle of 90°. That is, the part of the second exhaust aperture 52 (e.g., lower part) does not face the second housing 3 in the direction from the fan 42 toward the rear wall 22 when the electric apparatus 1 has an opening angle of 90°.

Also, the second exhaust apertures 52 are greater than the first exhaust apertures 51. The second exhaust aperture 52 is an elongated aperture longer than the first exhaust aperture 51. A lower end of the second exhaust aperture 52 reaches a position aligned with the lower wall 12 in the direction from the fan 42 toward the rear wall 22 (i.e., direction substantially parallel to the lower wall 12, or substantially horizontal direction). An opening of the second exhaust aperture 52 is, for example, more than twice as large as that of the first exhaust aperture 51.

Next, a positional relationship between the exhaust apertures 51 and 52 and the second housing 3 will be described.

Figure 7:
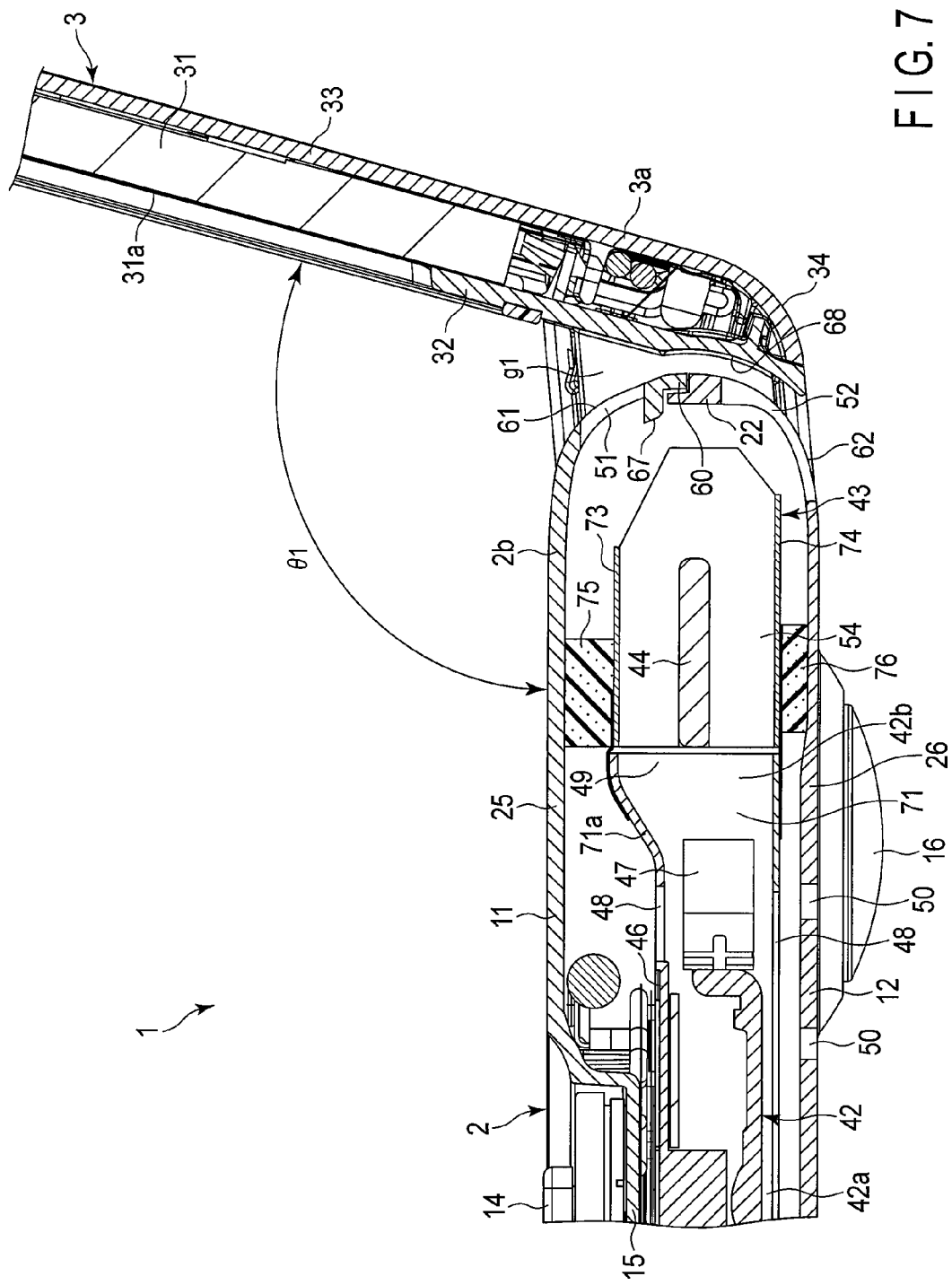
FIG. 7 is an exemplary sectional view of the electronic apparatus shown in FIG. 1 (opening angle 105°).

FIG. 7 shows the electronic apparatus 1 at a first opening angle $\theta 1$. The first opening angle $\theta 1$ is, for example, an opening angle at which the electronic apparatus 1 is usually used, and is, for example, between 100° and 110°.

While the second housing 3 faces substantially the whole of the first exhaust apertures 51 from behind at the first opening angle $\theta 1$, the second housing 3 does not face at least part of each of the second exhaust apertures 52 (e.g., lower part of second exhaust aperture 52). For example, the part of the second exhaust apertures 52 does not face the second housing 3 in the thickness direction (e.g., substantially vertical direction) of the first housing 2. Thus, part of the air from the fan 42 toward the rear wall 22 is efficiently discharged from the second exhaust apertures 52.

Also, a recess 68 facing the rear wall 22 of the first housing 2 is provided in the first end 3a of the second housing 3. The recess 68 is depressed in an arc shape along the rear wall 22 of the first housing 2. Since the recess 68 is provided, a gap is always kept between the second exhaust apertures 52 and the second housing 3. Accordingly, part of the air from the fan 42 toward the rear wall 22 is easy to discharge from the second exhaust apertures 52. Also, a gap is present also between the first exhaust apertures 51 and the second housing 3. Accordingly, part of the air from the fan 42 toward the rear wall 22 can be discharged also from the first exhaust apertures 51.

Figure 8:
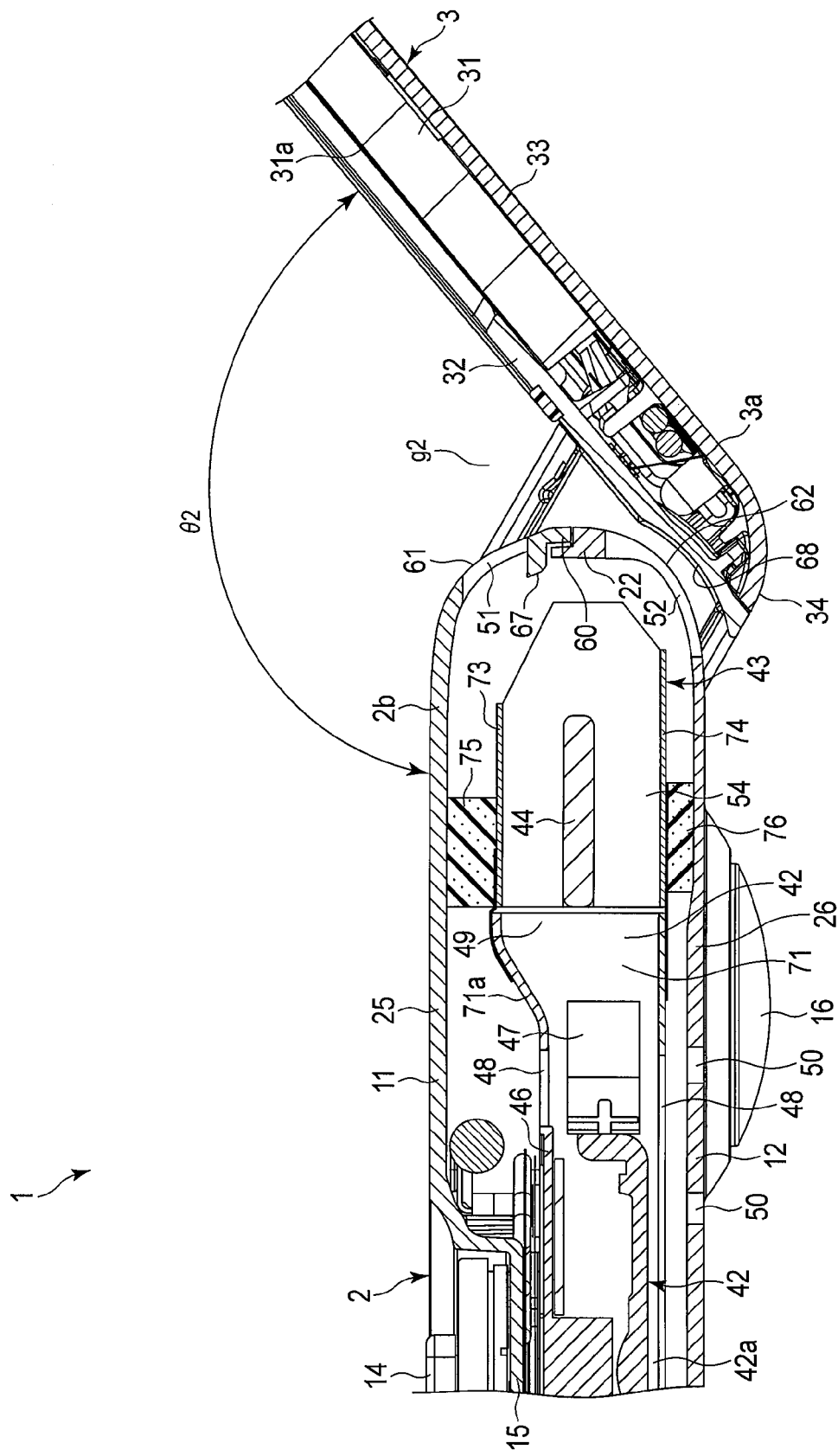
FIG. 8 is an exemplary sectional view of the electronic apparatus shown in FIG. 1 (opening angle 140°).

On the other hand, FIG. 8 shows the electronic apparatus 1 at a second opening angle $\theta 2$. The second opening angle $\theta 2$ indicates a state where the second housing 3 is largely rotated, for example, in order for a plurality of persons to view a screen, and is an opening angle greater than the first opening angle $\theta 1$. The second opening angle $\theta 2$ is, for example, 140°, but is not limited to this angle.

The first end 3a of the second housing 3 is located obliquely below the second exhaust apertures 52, and faces substantially the whole of the second exhaust apertures 52, for example, from behind or below at the second opening angle $\theta 2$. On the other hand, a gap g2 between the first exhaust apertures 51 and the second housing 3 is greater than a gap g1 between the first exhaust apertures 51 and the second housing 3 at the first opening angle $\theta 1$. The gap g2 between the first exhaust apertures 51 and the second housing 3 is greater than, for example, a gap between the heat sink 43 and the rear wall 22.

Thus, part of the air from the fan 42 toward the rear wall 22 is efficiently discharged from the first exhaust apertures 51. Also, since the recess 68 is provided in the second housing 3, and a gap is present also between the second exhaust apertures 52 and the second housing 3, part of the air from the fan 42 toward the rear wall 22 can be discharged also from the second exhaust apertures 52.

Next, a structure in the first housing 2 will be described in detail.

As shown in FIG. 6, the fan 42 is located below the keyboard attaching portion 15. Thus, a thin fan which can be contained between a bottom wall of the keyboard attaching portion 15 and the lower wall 12 of the first housing 2 is applied to the fan 42.

As shown in FIG. 6, the fan 42 is located near the lower wall 12 of the first housing 2. Thus, at least part of each of the first exhaust apertures 51 does not face the fan 42 in the direction from the fan 42 toward the rear wall 22. Also, substantially the whole area of the first exhaust apertures 51 does not face the impeller 47 of the fan 42 in the direction from the fan 42 toward the rear wall 22.

As shown in FIG. 6, the fan casing 46 comprises a duct 71 between the impeller 47 and the discharge opening 49. The duct 71 is located out of a lower portion of the keyboard attaching portion 15. The duct 71 comprises a wall portion 71a obliquely extending in a direction from the lower wall 12 toward the upper wall 11 of the first housing 2, and enlarges an air passage in the direction from the lower wall 12 toward the upper wall 11.

More specifically, the fan 42 comprises a first portion 42a and a second portion 42b. The first portion 42a is located between the bottom wall of the keyboard attaching portion 15 and the lower wall 12 of the first housing 2, and the impeller 47 is provided in the first portion 42a. The second portion 42b is located out of the lower portion of the keyboard attaching portion 15, and the discharge opening 49 is provided in the second portion 42b. The second portion 42b is thicker than the first portion 42a. The discharge opening 49 is thicker (e.g., vertically wider) than the first portion 42a. The discharge opening 49 faces both the first exhaust apertures 51 and the second exhaust apertures 52 in the direction from the fan 42 toward the rear wall 22.

As shown in FIG. 6, the heat sink 43 is thicker than the fan 42. Specifically, the heat sink 43 is thicker than the first portion 42a of the fan 42, and is substantially as thick as the second portion 42b of the fan 42. The heat sink 43 faces both the first exhaust apertures 51 and the second exhaust apertures 52 in the direction from the fan 42 toward the rear wall 22. Thus, part of the air from the fan 42 can flow to spread obliquely upward (e.g., toward the first exhaust apertures 51) along the plurality of fins 54 in the heat sink 43.

Figure 9:
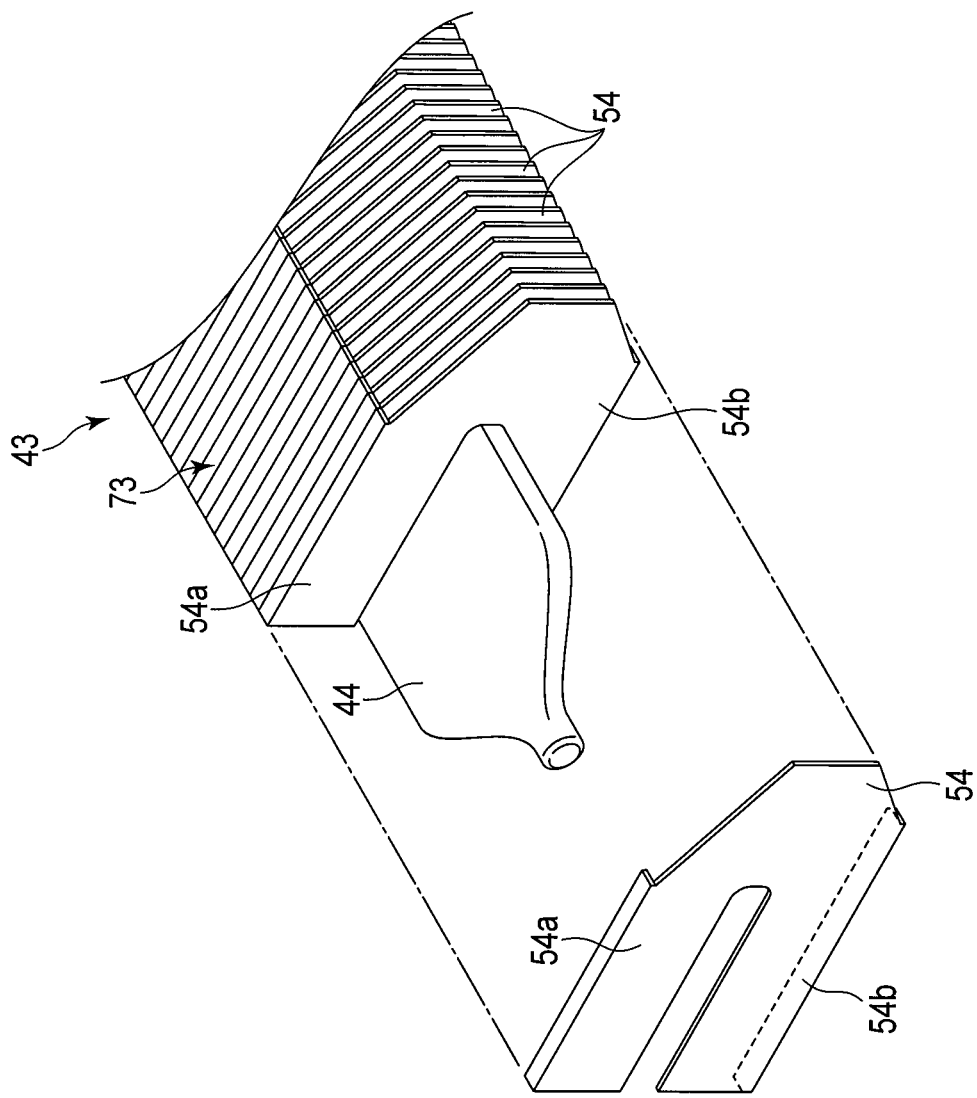
FIG. 9 is an exemplary partially-exploded perspective view of a heat sink shown in FIG. 2.

As shown in FIGS. 6 and 9, the heat sink 43 comprises the first closing portion 73 and the second closing portion 74. The first closing portion 73 is formed by folding each of first ends 54a of the plurality of fins 54 facing the upper wall 11 to contact an adjacent fin 54, and blocks gaps between the plurality of fins 54. The second closing portion 74 is formed by folding each of second ends 54b of the plurality of fins 54 facing the lower wall 12 to contact an adjacent fin 54, and blocks the gaps between the plurality of fins 54. A portion in which the first closing portion 73 or the second closing portion 74 of the heat sink 43 is not provided is an opening portion through which air flows.

The first closing portion 73 is smaller than the second closing portion 74. In other words, the heat sink 43 is largely opened upward rather than downward. The second closing portion 74 extends close to the outmost portion 60 of the rear wall 22 in comparison with the first closing portion 73. Accordingly, air is easy to flow to spread obliquely upward (i.e., toward the first exhaust apertures 51) inside the heat sink 43.

As shown in FIG. 6, a first air shielding portion 75 is placed between the first closing portion 73 of the heat sink 43 and the upper wall 11 of the first housing 2. Similarly, a second air shielding portion 76 is placed between the second closing portion 74 of the heat sink 43 and the lower wall 12 of the first housing 2. Consequently, air which is not yet heated in the first housing 2 is prevented from being pulled by air flowing through the heat sink 43 and being led near the exhaust apertures 51 and 52.

The electronic apparatus 1 having such a structure allows thermal radiation and designability to be improved, and a downsized and thin electronic apparatus can be obtained.

In a general electronic apparatus, exhaust apertures are often provided on a sidewall of a unit to prevent the exhaust apertures of the unit from being blocked by a display unit in a state where the display unit of a notebook portable computer is erected. However, such design sometimes restricts the designability and interior layout of the electronic apparatus.

On the other hand, the downsized and thin electronic apparatus is desired. Thus, interior mounting components need to be efficiently arranged, and sometimes the exhaust apertures have to be provided on a rear wall of the housing. In this case, the exhaust apertures on the rear wall of the housing may be blocked by the display unit depending on an opening/closing state of the display unit. This may lead to reduction in thermal radiation efficiency of the electronic apparatus.

Then, the electronic apparatus 1 of this embodiment comprises the first housing 2, the fan 42 contained in the first housing 2, and the second housing 3 rotatably connected to the first housing 2. The first housing 2 comprises a first wall (e.g., upper wall 11), a second wall (e.g., lower wall 12) located opposite to the first wall, and a third wall (e.g., rear wall 22) extending between the first wall and the second wall and faces the second housing 3 when the second housing 3 is raised from the first housing 2. The third wall comprises an outmost portion of the third wall in a direction from the fan 42 toward the third wall (e.g., outmost portion 60), the first area 61 which is inclined and extends between the outmost portion 60 and the first wall and in which the first opening 64 is provided, and the second area 62 which is inclined and extends between the outmost portion 60 and the second wall and in which the second opening 65 is provided.

In such a structure, one of openings (first opening 64 or second opening 65) is always opened regardless of the opening/closing state of the second housing 3 which is a display housing. Thus, even if the exhaust apertures 51 and 52 are provided on the rear wall 22 of the first housing 2, efficient thermal radiation can be realized and the thermal radiation of the electronic apparatus 1 can be improved. Also, if the thermal radiation is improved, a cooling device such as the fan 42 can be downsized. This allows the designability of the electronic apparatus to be improved, and the downsized and thin electronic apparatus can be obtained.

In this embodiment, the second housing 3 faces the first opening 64 at the first opening angle $\theta 1$, and does not face at least part of the second opening 65. Thus, the air from the fan 42 can be efficiently discharged from the second opening 65 at the first opening angle $\theta 1$.

In this embodiment, the second housing 3 faces the second opening 65 at the second opening angle $\theta 2$ which is greater than the first opening angle $\theta 1$, and the gap g2 between the first opening 64 and the second housing 3 at the second opening angle $\theta 2$ is greater than the gap g1 between the first opening 64 and the second housing 3 at the first opening angle $\theta 1$. Thus, the air from the fan 42 can be efficiently discharged from the first opening 64 at the second opening angle $\theta 2$.

In this embodiment, the first opening 64 comprises the plurality of first exhaust apertures 51. The second opening 65 comprises the plurality of second exhaust apertures 52. The plurality of first exhaust apertures 51 and the plurality of second exhaust apertures 52 are mutually shifted to be alternately positioned in a longitudinal direction of the third wall. According to such a structure, strength of a portion between the first exhaust apertures 51 and the second exhaust apertures 52 (e.g., outmost portion 60) is easily secured. Also, when the first exhaust apertures 51 and the second exhaust apertures 52 are arranged in the thickness direction of the first housing 2, the second exhaust apertures 52 may be completely seen from above through the first exhaust apertures 51. However, if the plurality of first exhaust apertures 51 and the plurality of second exhaust apertures 52 are mutually shifted to be alternately positioned in the longitudinal direction of the third wall, the second exhaust apertures 52 are hard to see even from above through the first exhaust apertures 51, and the designability of the electronic apparatus 1 can be improved.

In this embodiment, the second exhaust aperture 52 is greater than the first exhaust aperture 51. In such a structure, the first exhaust apertures 51 easily seen by a user can be formed to be small and the second exhaust apertures 52 hardly seen by the user can be formed to be large. This further contributes to the improvement of the designability of the electronic apparatus 1.

In this embodiment, at least part of the first opening 64 does not face the fan 42 in the direction from the fan 42 toward the third wall. In such a structure, the first area 61 of the rear wall 22 is effectively utilized, and the first opening 64 can be enlarged. This contributes to the further improvement of the thermal radiation.

In this embodiment, the fan 42 comprises the duct 71 comprising the wall portion 71a inclined and extending in a direction from the second wall toward the first wall, and configured to enlarge the air passage. This structure allows the air from the fan 42 to be effectively led to the first exhaust apertures 51. This contributes to the further improvement of the thermal radiation.

In this embodiment, the electronic apparatus 1 further comprises the heat sink 43 located between the fan 42 and the third wall, and comprising the plurality of fins 54 extending in a direction from the first wall toward the second wall. The heat sink 43 is thicker than the fan 42, and faces both the first opening 64 and the second opening 65. This structure allows the air from the fan 42 to efficiently flow toward the first exhaust apertures 51 along the fins 54 in the heat sink 43. This contributes to the further improvement of the thermal radiation.

In this embodiment, the heat sink 43 comprises a first closing portion 73 blocking gaps between the plurality of fins 54, the first closing portion facing the first wall, and a second closing portion 74 blocking the gaps between the plurality of fins 54, the second closing portion facing the second wall. The first closing portion 73 is smaller than the second closing portion 74. According to this structure, the air from the fan 42 is easy to flow toward the first exhaust apertures 51. This contributes to the further improvement of the thermal radiation.

The above-described embodiment is not limited. In the implementation stage, the structural elements may be modified without departing from the scope. Various modifications can be realized by appropriately combining the structural elements disclosed in the embodiment. For instance, some of the disclosed structural elements may be deleted. Some structural elements of different embodiments may be combined appropriately.

For example, the first opening 64 and the second opening 65 may be connected to each other. That is, the first opening 64 and the second opening 65 may be formed by an opening extending both the first area 61 and the second area 62 of the rear wall 22. Also, the plurality of first exhaust apertures 51 and the plurality of second exhaust apertures 52 are not necessarily mutually shifted to be alternately positioned in the longitudinal direction of the rear wall 22. They may be arranged in the thickness direction of the first housing 2. Also, shapes, sizes or numbers of the first exhaust apertures 51 and the second exhaust apertures 52 are not especially limited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a first housing;
   a fan in the first housing; and
   a second housing rotatably attached to the first housing,
   wherein the first housing comprises a first wall, a second wall opposite to the first wall, and a third wall between the first wall and the second wall, the third wall is configured to face the second housing when the second housing is raised from the first housing,
   wherein the third wall comprises an outmost portion projecting in a direction from the fan toward the third wall, a first area obliquely extending between the outmost portion and the first wall and comprising a first opening, and a second area obliquely extending between the outmost portion and the second wall and comprising a second opening,
   wherein the second housing is configured to face the first opening and to leave at least part of the second opening open at a first angle between the first housing and the second housing, and
   wherein the second housing is configured to face the second opening at a second angle between the first housing and the second housing which is greater than the first angle, and a gap between the first opening and the second housing at the second angle is greater than a gap between the first opening and the second housing at the first angle.

2. The electronic apparatus of claim 1, wherein the fan is configured to send air toward the third wall.

3. The electronic apparatus of claim 1, wherein
   the first opening comprises first apertures,
   the second opening comprises second apertures, and
   the first apertures and the second apertures are mutually shifted to be alternately positioned in a longitudinal direction of the third wall.

4. The electronic apparatus of claim 3, wherein a number of the second apertures is greater than a number of the first exhaust apertures.

5. The electronic apparatus of claim 1, wherein at least part of the first opening does not face the fan in a direction from the fan toward the third wall.

6. The electronic apparatus of claim 5, wherein the fan comprises a duct, the duct comprising a wall portion obliquely extending in a direction from the second wall toward the first wall in order to enlarge an air passage.

7. The electronic apparatus of claim 5, further comprising:
   a heat sink between the fan and the third wall, the heat sink comprising fins extending in a direction from the first wall toward the second wall,
   wherein the heat sink is thicker than the fan and faces both the first opening and the second opening.

8. The electronic apparatus of claim 7, wherein
   the heat sink comprises a first closing portion closing gaps between the fins, the first closing portion facing the first wall, and a second closing portion closing the gaps between the fins, the second closing portion facing the second wall, and
   the first closing portion is smaller than the second closing portion.

* * * * *